United States Patent
Umeda

(10) Patent No.: US 7,868,519 B2
(45) Date of Patent: Jan. 11, 2011

(54) PIEZOELECTRIC RESONATOR INCLUDING AN ACOUSTIC REFLECTOR PORTION

(75) Inventor: Keiichi Umeda, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/714,597

(22) Filed: Mar. 1, 2010

(65) Prior Publication Data

US 2010/0148638 A1     Jun. 17, 2010

Related U.S. Application Data

(63) Continuation of application No. PCT/JP2008/062464, filed on Jul. 10, 2008.

(30) Foreign Application Priority Data

Sep. 6, 2007    (JP) .............................. 2007-231854

(51) Int. Cl.
  H01L 41/04   (2006.01)
  H01L 41/08   (2006.01)
(52) U.S. Cl. .................................................... 310/320
(58) Field of Classification Search ......... 310/320–322, 310/324
See application file for complete search history.

(56) References Cited

U.S. PATENT DOCUMENTS

| 2002/0084873 A1 | 7/2002 | Ella et al. |
| 2006/0119230 A1 | 6/2006 | Umeda et al. |
| 2007/0096851 A1 | 5/2007 | Uno et al. |
| 2009/0017326 A1 * | 1/2009 | Barber et al. ............... 428/621 |

FOREIGN PATENT DOCUMENTS

| JP | 2002-251190 A | 9/2002 |
| JP | 2003-060478 A | 2/2003 |
| JP | 2006-013839 A | 1/2006 |
| JP | 2006-166036 A | 6/2006 |
| JP | 2007-060414 A | 3/2007 |
| JP | 2007-129391 A | 5/2007 |
| JP | 2007-181185 A | 7/2007 |

OTHER PUBLICATIONS

Official Communication issued in International Patent Application No. PCT/JP2008/062464, mailed on Aug. 19, 2008.
Lanz et al., "Properties of Sputter Deposited AlN, MO, W and SIO2 Thin-Films for Bulk-Acoustic-Wave Application on 200MM SI Substrates," The Eighth International Symposium on Sputtering and Plasma Process, 2005, pp. 323-326.

* cited by examiner

*Primary Examiner*—J. SanMartin
(74) *Attorney, Agent, or Firm*—Keating & Bennett, LLP

(57) ABSTRACT

A piezoelectric resonator that achieves stable quality and improved resonance characteristics includes an acoustic reflector portion disposed between a substrate and a vibration portion, which includes a piezoelectric thin film sandwiched between a pair of electrodes, and a plurality of low acoustic impedance layers made of a material having relatively low acoustic impedance and a plurality of high acoustic impedance layers formed made of a material having relatively high acoustic impedance, the acoustic impedance layers being disposed alternately, and adjustment layers, which are disposed between the high acoustic impedance layers and the low acoustic impedance layers on the substrate sides of the high acoustic impedance layers and which have an acoustic impedance value intermediate between that of the high acoustic impedance layers and that of the low acoustic impedance layers. The low acoustic impedance layers and the high acoustic impedance layers have compressive stresses and the adjustment layers have a tensile stress.

5 Claims, 6 Drawing Sheets

FIG. 3 (1a)
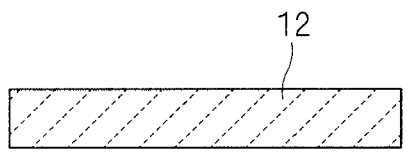
FIG. 3 (1b)
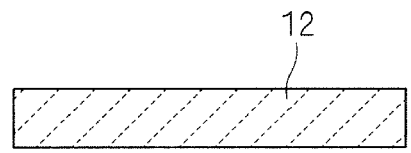
FIG. 3 (2a)
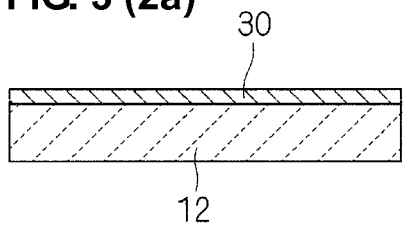
FIG. 3 (2b)
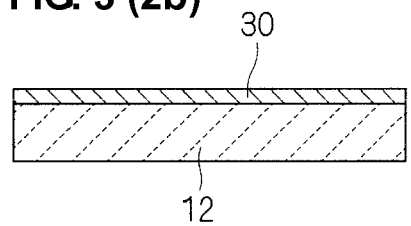
FIG. 3 (3b)
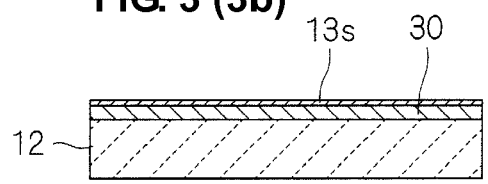
FIG. 3 (4a)
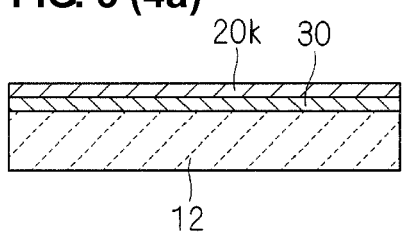
FIG. 3 (4b)
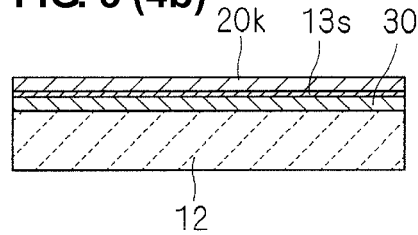
FIG. 3 (5a)
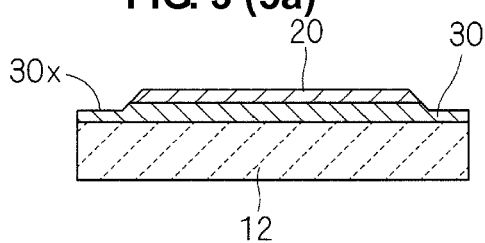
FIG. 3 (5b)
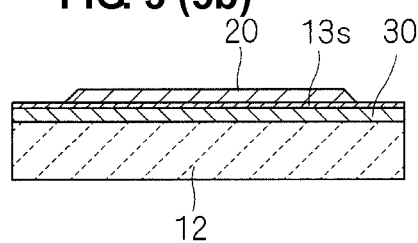
FIG. 3 (6a)
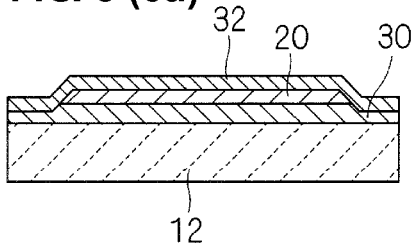
FIG. 3 (6b)
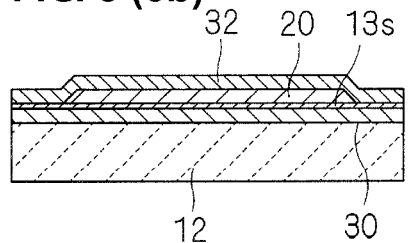

FIG. 4 (7b)
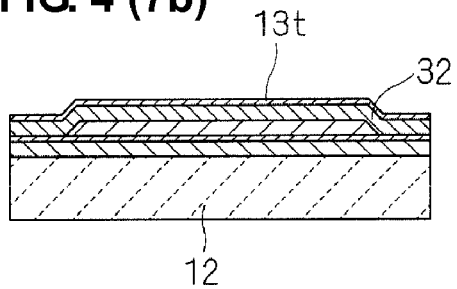
FIG. 4 (8a)
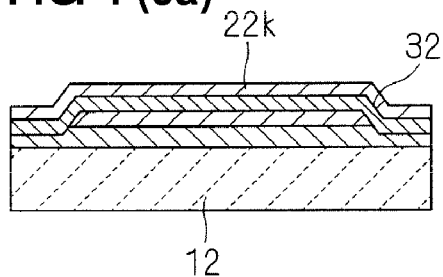
FIG. 4 (8b)
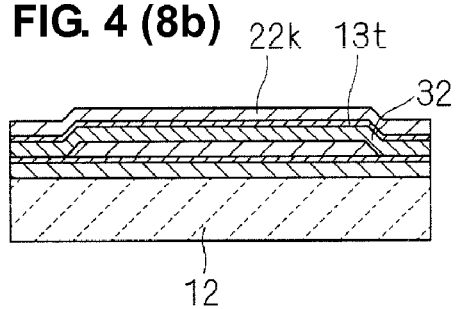
FIG. 4 (9a)
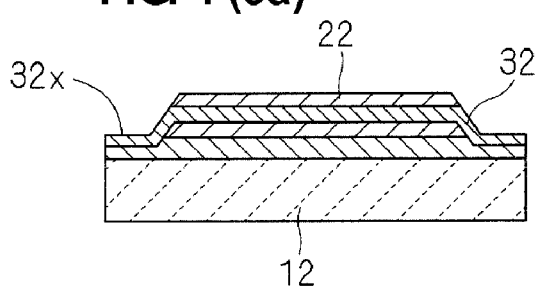
FIG. 4 (9b)
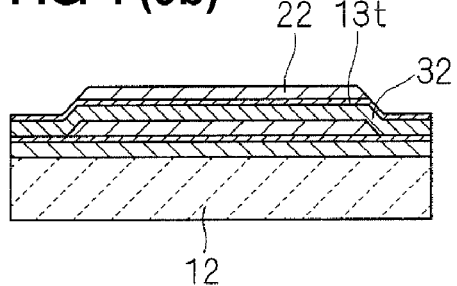
FIG. 4 (10a)
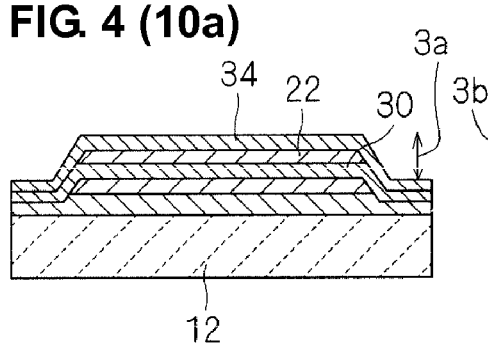
FIG. 4 (10b)
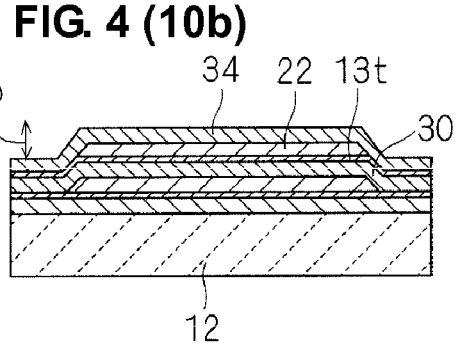
FIG. 4 (11a)
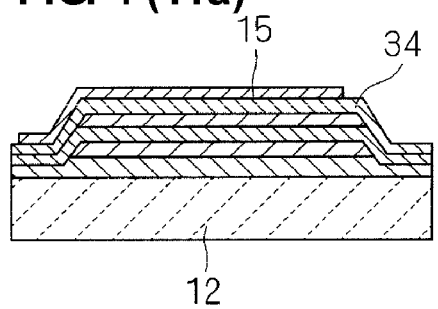
FIG. 4 (11b)
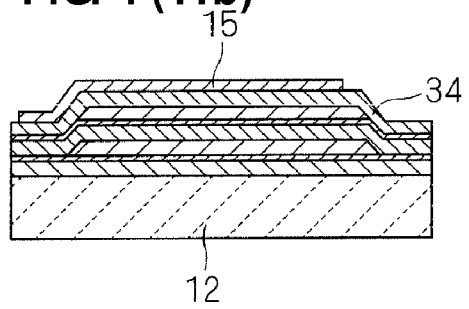

PIEZOELECTRIC RESONATOR INCLUDING AN ACOUSTIC REFLECTOR PORTION

BACKGROUND OF THE INVENTION

1. Field of the Invention

The present invention relates to a piezoelectric resonator. In particular, the present invention relates to a piezoelectric resonator including an acoustic reflector portion to acoustically separate a vibration portion, which includes a piezoelectric thin film sandwiched between a pair of electrodes, from a substrate and to support the vibration portion.

2. Description of the Related Art

Previously, piezoelectric resonators (Bulk Acoustic Wave resonators or BAW resonators) taking advantage of thickness vibration of a piezoelectric thin film and piezoelectric filters formed from the piezoelectric resonators include a type provided with a cavity and a type provided with an acoustic reflector portion to acoustically separate a vibration portion, which includes a piezoelectric thin film sandwiched between a pair of electrodes, from a substrate and to support the vibration portion.

Regarding the latter type, as in a piezoelectric resonator 100 indicated by a sectional view shown in FIG. 8, an acoustic reflector portion 122 is disposed between a vibration portion 120, in which a piezoelectric thin film 116 is sandwiched between a pair of electrodes 115 and 117, and a substrate 112. Regarding the acoustic reflector portion 122, low acoustic impedance layers 114a and 114b formed from a material having relatively low acoustic impedance and high acoustic impedance layers 113a and 113b formed from a material having relatively high acoustic impedance are laminated alternately. The acoustic reflector portion 122 reflects vibration from the vibration portion 120 and acoustically separates the vibration portion 120 from the substrate 112 in such a way that the vibration is not transferred to the substrate 112. For example, a metal material (W, Mo) is used for a high acoustic impedance layer, and a dielectric material ($SiO_2$, $Si_3N_4$) is used for a low acoustic impedance layer (refer to Japanese Unexamined Patent Application Publication No. 2002-251190, for example).

Furthermore, as is indicated by a sectional view shown in FIG. 9, the document Proceedings of The 8th International Symposium on Sputtering and Plasma Process, "Properties of Sputter Deposited AlN, Mo, W and $SiO_2$ Thin-Films for Bulk-Acoustic-Wave Applications on 200 mm Si Substrates" discloses that $SiO_2$ is used for a low acoustic impedance layer, W is used for a high acoustic impedance layer, and AlN is used for a seed layer.

Regarding the piezoelectric resonator of Japanese Unexamined Patent Application Publication No. 2002-251190, in the case where the metal (for example, W) serving as the high acoustic impedance layer is etched, there is a possibility that the low acoustic impedance layer thereunder is also etched. If a height difference formed around a portion, in which the electrodes are opposed to each other, of the vibration portion increases because of such over etching, a break in the electrode occurs easily. Furthermore, in the case where the film thickness of the high acoustic impedance layer is large, the risk of peeling of the film and cracking of the substrate increases. Consequently, it is difficult to conduct production with stable quality.

Regarding the publication "Properties of Sputter Deposited AlN, Mo, W and $SiO_2$ Thin-Films for Bulk-Acoustic-Wave Applications on 200 mm Si Substrates," the W film is specified to have a tensile stress for the purpose of stress adjustment of the acoustic reflector portion. The W film having the tensile stress exhibits poor crystallinity and tends to become a non-dense film, so that the resonance characteristics are degraded.

SUMMARY OF THE INVENTION

In order to solve the above-described problems, preferred embodiments of the present invention provide a piezoelectric resonator with stable quality and improved resonance characteristics.

A piezoelectric resonator according to a preferred embodiment of the present invention includes a substrate, a vibration portion including a piezoelectric thin film sandwiched between a pair of electrodes, and an acoustic reflector portion disposed between the substrate and the vibration portion. The acoustic reflector portion includes a plurality of low acoustic impedance layers made of a material having relatively low acoustic impedance and a plurality of high acoustic impedance layers made of a material having relatively high acoustic impedance, the low and high acoustic impedance layers being disposed alternately between the substrate and the vibration portion, and at least one adjustment layer disposed between one of the high acoustic impedance layer and one of the low acoustic impedance layer and having an acoustic impedance value between the acoustic impedance of the high acoustic impedance layers and the acoustic impedance of the low acoustic impedance layers. The low acoustic impedance layers and the high acoustic impedance layers have compressive stresses, and the at least one adjustment layer has a tensile stress.

In the above-described configuration, the low acoustic impedance layer and the high acoustic impedance layer have the compressive stresses and, therefore, the films become dense and the crystallinity is good as compared with those in the case of the tensile stress. Consequently, as for an elastic wave, the loss is low, unnecessary scattering of the elastic wave is reduced and minimized, and the resonance characteristics of the piezoelectric resonator are improved.

If an absolute value of compressive stress is large, film peeling occurs easily. However, a total stress of the acoustic reflector portion can be adjusted by the at least one adjustment layer having the tensile stress. Consequently, an occurrence of film peeling can be prevented. Furthermore, the crystallinity of the high acoustic impedance layer and the amount of over etching of the low acoustic impedance layer can be adjusted by the at least one adjustment layer.

Accordingly, the quality of the piezoelectric resonator becomes stable and the resonance characteristics of the piezoelectric resonator can be improved.

Preferably, the acoustic reflector portion between the substrate and the vibration portion includes adhesive layers disposed between the high acoustic impedance layers and the adjustment layers.

In this case, the adhesion between the adjustment layer and the high acoustic impedance layer is improved and, thereby, film peeling and substrate cracking do not occur easily. Consequently, the quality of the piezoelectric resonator becomes more stable.

Preferably, the adjustment layer is made of a material that is resistant to etching with a fluorine based gas.

In this case, in etching of the high acoustic impedance layer, etching is stopped at the adjustment layer, and it is possible that the low acoustic impedance layer thereunder is not etched. Consequently, a dimension of a height difference formed around a portion, in which the electrodes are opposed to each other, of the vibration portion can be minimized and an occurrence of a break in the electrode can be prevented. As a result, the quality of the piezoelectric resonator becomes even more stable.

Preferably, silicon oxide is used for the low acoustic impedance layer, tungsten is used for the high acoustic impedance layer, and aluminum nitride is used for the adjustment layer, for example.

In this case, a piezoelectric resonator having stabilized quality and improved resonance characteristics can be produced easily. Aluminum nitride is suitable for the adjustment layer because of a wide range of adjustment of stress while the crystallinity is maintained.

Preferably, titanium is used for the adhesive layer, for example.

In this case, a piezoelectric resonator having stabilized quality and improved resonance characteristics can be produced easily.

Thus, a piezoelectric resonator according to a preferred embodiment of the present invention achieves stable quality and improved resonance characteristics.

Other elements, features, steps, characteristics and advantages of the present invention will become more apparent from the following detailed description of the preferred embodiments with reference to the attached drawings.

BRIEF DESCRIPTION OF DRAWINGS

FIG. 3(1a)-3(6b) are sectionals views showing production steps of a piezoelectric resonator according to a preferred embodiment of the present invention.

FIG. 4(7b)-4(11b) are sectional views showing production steps of a piezoelectric resonator according to a preferred embodiment of the present invention.

DETAILED DESCRIPTION OF THE PREFERRED EMBODIMENTS

Examples 1 to 4 according to preferred embodiments according to the present invention will be described below with reference to FIG. 1 to FIG. 7.

EXAMPLE 1

A piezoelectric resonator 10 of Example 1 will be described with reference to FIG. 1 to FIG. 4.

Figure 1:
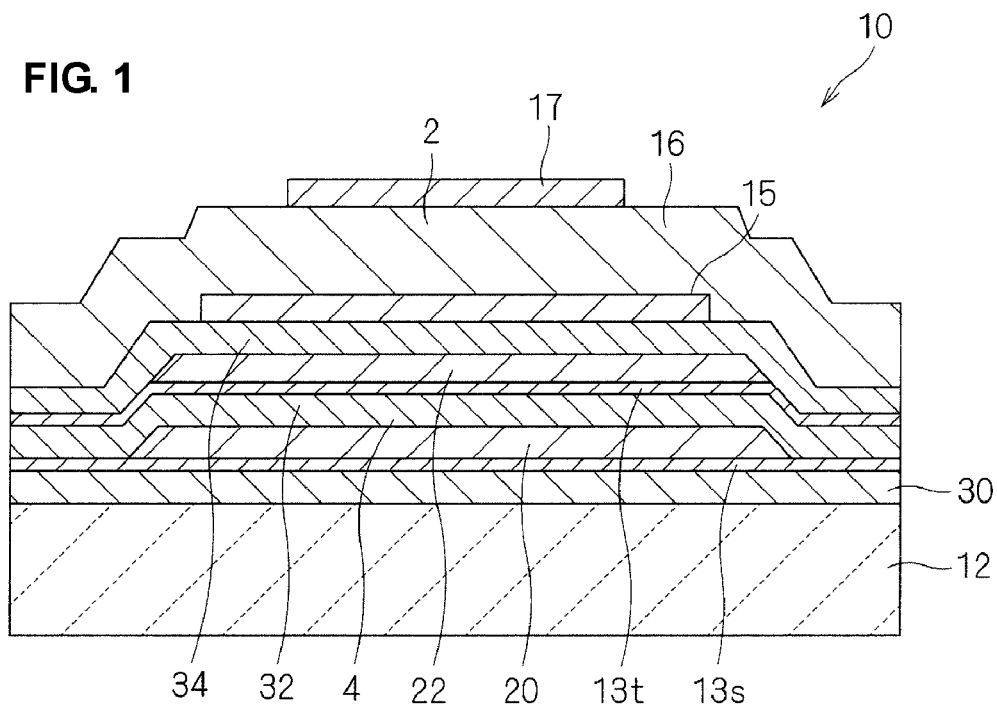
FIG. 1 is a sectional view of a piezoelectric resonator according to a preferred embodiment of the present invention.

As indicated by a sectional view shown in FIG. 1, the piezoelectric resonator 10 preferably includes a vibration portion 2, which includes a piezoelectric thin film 16 sandwiched between an upper electrode 17 and a lower electrode 15, and the vibration portion 2 is acoustically separated from a substrate 12 with an acoustic reflector portion 4 therebetween.

In the acoustic reflector portion 4, three layers of low acoustic impedance layers 30, 32, and 34 and two layers of high acoustic impedance layers 20 and 22 are disposed alternately, for example. The first low acoustic impedance layer 30 is in contact with the substrate 12 and the third low acoustic impedance layer 34 is in contact with the lower electrode 15.

Furthermore, an adjustment layer 13s is disposed between the first high acoustic impedance layer 20 and the first low acoustic impedance layer 30, and an adjustment layer 13t is disposed between the second high acoustic impedance layer 22 and the second low acoustic impedance layer 32.

The low acoustic impedance layers 30, 32, and 34 are preferably formed by using silicon oxide ($SiO_2$) or carbon-containing silicon oxide (SiOC), for example. The high acoustic impedance layers 20 and 22 are preferably formed from a metal, e.g., tungsten (W) and molybdenum (Mo), for example. The adjustment layers 13s and 13t are preferably formed by using aluminum nitride (AlN), alumina ($Al_2O_3$), chromium oxide ($Cr_2O_3$), diamond, or diamond-like carbon, for example.

For example, the low acoustic impedance layers 30, 32, and 34 are formed from $SiO_2$ (for example, about 820 μm), the high acoustic impedance layers 20 and 22 are formed from W (for example, about 820 μm), and the adjustment layers 13s and 13t are formed from AlN (for example, about 30 μm to about 200 μm). Table 1 described below shows the acoustic impedance of the material for each layer.

TABLE 1

| | Acoustic impedance $10^{10}$ [g/s · m²] |
|---|---|
| Aluminum nitride | 3.7 |
| Tungsten | 10.0 |
| Silicon oxide | 1.2 |

In the case where AlN is used for the adjustment layers 13s and 13t, it is desirable that the C axis crystallinity is poor and the piezoelectric property is not provided or is at a very low level. This is because charges generated by the piezoelectric property of AlN are consumed as an ohmic loss in the high acoustic impedance layers 20 and 22.

The high acoustic impedance layers 20 and 22 are patterned in such a way as to be disposed merely just below the vibration portion 2 and in the vicinity thereof in order that capacitive coupling with adjacent resonators is prevented.

For example, in the steps of laminating individual layers on the substrate 12 sequentially, the W films for forming the high acoustic impedance layers 20 and 22 are etched through reactive ion etching (RIE) by using a fluorine based gas and, thereby, the high acoustic impedance layers 20 and 22 are patterned. In the case where the adjustment layers 13s and 13t are AlN films not easily etched with the fluorine based gas, etching is stopped at the adjustment layers 13s and 13t, and the $SiO_2$ films serving as the low acoustic impedance layers 30 and 32 under the adjustment layers 13s and 13t are not etched.

The film configuration of the lower electrode 15 is specified to be Pt/Ti/AlCu/Ti. AlCu refers to an alloy of Al and Cu, and it is preferable that the Cu concentration is about 0.5% to about 10%, for example. As for the piezoelectric thin film 16, AlN is preferably used. The film configuration of the upper electrode 17 is specified to be AlCu/Ti/Pt/Ti.

Next, an example of methods for manufacturing the piezoelectric resonator 10 will be described with reference to FIG. 3 and FIG. 4. In FIG. 3 and FIGS. 4, (1a) to (11a) on the left side are sectional views showing production steps of a piezoelectric resonator of Reference example, and (1b) to (11b) on the right side are sectional views showing production steps of the piezoelectric resonator 10 of Example 1. The adjustment layers 13s and 13t are formed in the piezoelectric resonator 10 of Example 1, whereas an adjustment layer is not formed in the piezoelectric resonator of Reference example.

Initially, as shown in FIGS. 3 (1a) and (1b), the substrate 12 is prepared. As for the substrate 12, an inexpensive substrate having excellent workability is used. A Si or glass substrate having a flat surface is better.

Subsequently, as shown in FIGS. 3 (2a) and (2b), a $SiO_2$ film serving as the first low acoustic impedance layer 30 in the acoustic reflector portion 4 is formed all over the surface of the substrate 12 by using a technique, e.g., a sputtering method or a thermal oxidation method.

Thereafter, in merely Example 1, as shown in FIG. 3 (3b), an AlN film serving as the adjustment layer 13s is further formed on the $SiO_2$ film 30.

Then, as shown in FIGS. 3 (4a) and (4b), a W film 20k serving as the first high acoustic impedance layer 20 in the acoustic reflector portion is formed on the $SiO_2$ film 30 or the AlN film 13s by using a technique, e.g., a sputtering method.

Next, as shown in FIGS. 3 (5a) and (5b), the W film other than resonator portion is removed by using patterning through photolithography and etching (for example, reactive ion etching) in such a way that insulation at least between resonators of a filter can be ensured and, thereby, the first high acoustic impedance layer 20 is formed from the remaining W film.

In the etching in Reference example, as shown in FIG. 3 (5a), regarding the $SiO_2$ film 30, a portion 30x around the high acoustic impedance layer 20 is etched and the thickness becomes small easily. On the other hand, in Example 1, as shown in FIG. 3 (5b), the etching is stopped by the AlN film serving as the adjustment layer 13s and, therefore, the $SiO_2$ film 30 does not become thin.

Thereafter, film formation and the like of the $SiO_2$ film, the AlN film, and the W film are repeated likewise.

That is, as shown in FIGS. 3 (6a) and (6b), a $SiO_2$ film serving as the second low acoustic impedance layer 32 in the acoustic reflector portion 4 is formed. Subsequently, in merely Example 1, as shown in FIG. 4 (7b), an AlN film serving as the adjustment layer 13t is formed on the $SiO_2$ film 32.

Then, as shown in FIGS. 4 (8a) and (8b), a W film 22k serving as the second high acoustic impedance layer 22 in the acoustic reflector portion is formed on the $SiO_2$ film 32 or the AlN film 13t. Next, as shown in FIGS. 4 (9a) and (9b), the W film 22k is etched, so that the second high acoustic impedance layer 22 is patterned.

In the etching in Reference example, as shown in FIG. 4 (9a), regarding the $SiO_2$ film 32, a portion 32x around the high acoustic impedance layer 22 is etched and the thickness becomes small easily. On the other hand, in Example 1, as shown in FIG. 4 (9b), the etching is stopped by the adjustment layer 13t and, therefore, the $SiO_2$ film 32 does not become thin.

Subsequently, as shown in FIGS. 4 (10a) and (10b), a $SiO_2$ film serving as the third low acoustic impedance layer 34 in the acoustic reflector portion is formed. In this manner, the acoustic reflector portion is completed.

As indicated by arrows 3a and 3b shown in FIGS. 4 (10a) and (10b), regarding the dimension of the height difference between the periphery portion, in which the $SiO_2$ films 30, 32, and 34 are stacked, and the center portion, in which the $SiO_2$ films 30, 32, and 34 and the W films 20 and 22 are stacked, the dimension in Example 1 is smaller than the dimension in the reference example. Regarding the reference example, since this height difference is large, as shown in FIG. (11a), in the lower electrode 15 formed on the acoustic reflector portion, a break occurs easily at the portion where the height difference occurs. On the other hand, regarding Example 1, since the height of the height difference is minimized, in the lower electrode 15, a break does not occur easily at the portion where the height difference occurs.

Figure 2:
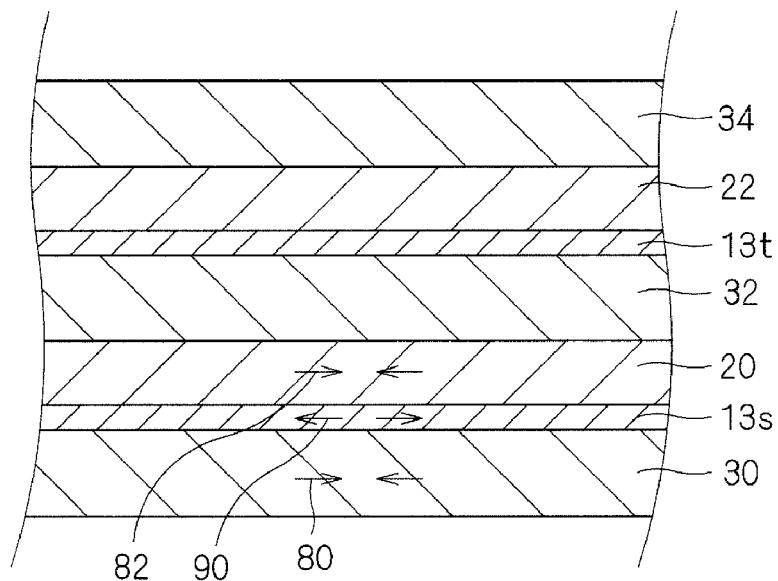
FIG. 2 is a magnified sectional view of a key portion of a piezoelectric resonator according to a preferred embodiment of the present invention.

FIG. 2 is a magnified sectional view of a key portion of the acoustic reflector portion 4 in the piezoelectric resonator 10 of Example 1. Formation is conducted in such a way that the film stresses of the low acoustic impedance layers 30, 32, and 34, which are the $SiO_2$ films, and the high acoustic impedance layers 20 and 22, which are the W films, become compressive stresses, as indicated by arrows 80 and 82 in FIG. 2, and the film stresses of the adjustment layers 13s and 13t become tensile stresses, as indicated by arrows 90.

A method for forming the AlN film is described in publicly known documents, for example, K. Umeda et al., Vacuum 80 (2006) p. 658-661. In this document, AlN is formed by an RF magnetron sputtering method. In that case, the stress of the AlN film is adjusted from compressive to tensile by the RF power, the gas pressure, and the substrate bias and, in addition, it is known that the crystallinity of AlN at that time is almost constant.

In order to improve the crystallinity of the W film, it is necessary to improve the crystallinity of the adjustment layer serving as a substrate therefor. Consequently, the AlN film is suitable for the adjustment layer because of a wide range of adjustment of stress while the crystallinity is maintained.

Regarding the W film having a film thickness of about 300 nm, for example, experimentally obtained relationships between the stress and the crystallinity and between the stress and the surface roughness are shown in Table 2 described below.

TABLE 2

| | Film stress Stress (MPa) | X-ray rocking curve full width half maximum FWHM (deg) | Surface roughness Ra (nm) |
|---|---|---|---|
| W film (1) | −2064 | 2.9 | 0.3 |
| W film (2) | −310 | 10.4 | 5.0 |

From Table 2, the W film (1) having a large compressive stress is preferable for the high acoustic impedance layer of the acoustic reflector.

As an absolute value of compressive stress of the W film becomes large, the film becomes dense, the film surface becomes flat, and the crystallinity becomes good. This is because in the case where the crystallinity is good as described above, as for an elastic wave, the loss is low, unnecessary scattering of the elastic wave is at a low level, and the resonance characteristics of the piezoelectric resonator are improved.

If the absolute value of compressive stress is large, film peeling occurs easily. However, a total stress of the acoustic reflector portion can be adjusted by the adjustment layer having the tensile stress. Consequently, an occurrence of film peeling can be prevented.

Therefore, even when a high quality W film having a compressive stress is used for the high acoustic impedance layer of the acoustic reflector portion, the stress of the whole acoustic reflector portion can be relaxed by the AlN adjustment layer having a tensile stress. Furthermore, the crystallinity of the high acoustic impedance layer and the amount of over etching of the low acoustic impedance layer can be adjusted by the adjustment layer.

Accordingly, the piezoelectric resonator 10 having stabilized quality and improved resonance characteristics can be produced.

EXAMPLE 2

A piezoelectric resonator 10a of Example 2 will be described with reference to FIG. 5.

Figure 5:
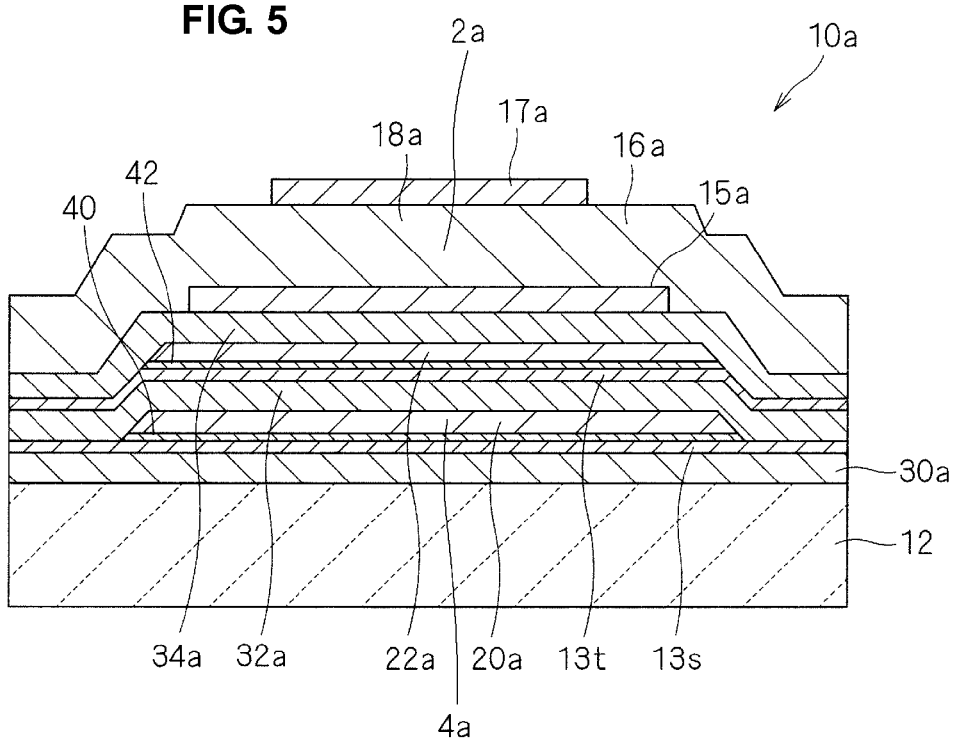
FIG. 5 is a sectional view of a piezoelectric resonator according to a preferred embodiment of the present invention.

As indicated by a sectional view shown in FIG. 5, the piezoelectric resonator 10a of Example 2 preferably has substantially the same configuration as that of the piezoelectric resonator 10 of Example 1 shown in FIG. 1, and the same effects as those in Example 1 are obtained. In the following description, the points different from Example 1 will be explained mainly, and the same constituent portions as those in Example 1 are represented by the same reference numerals.

The piezoelectric resonator 10a of Example 2 is different from Example 1 in configuration of an acoustic reflector portion 4a. Specifically, in the acoustic reflector portion 4a of Example 2, adhesive layers 40 and 42 are disposed between the adjustment layers 13s and 13t and high acoustic impedance layers 20a and 22a. The adhesive layers 40 and 42 are patterned through etching or the like at the same time with the high acoustic impedance layers 20a and 22a thereon.

For example, in the case where the high acoustic impedance layers 20a and 22a are W, the low acoustic impedance layers 30a, 32a, and 33a are $SiO_2$, and the adjustment layers 13s and 13t are AlN, it is desirable that the adhesive layers 40 and 42 are Ti.

The adhesion between the high acoustic impedance layers 20a and 22a and the adjustment layers 13s and 13t is improved by the adhesive layers 40 and 42, film peeling and substrate cracking do not occur easily, and the quality of the piezoelectric resonator 10a becomes more stable.

EXAMPLE 3

A piezoelectric resonator 10b of Example 3 will be described with reference to FIG. 6.

Figure 6:
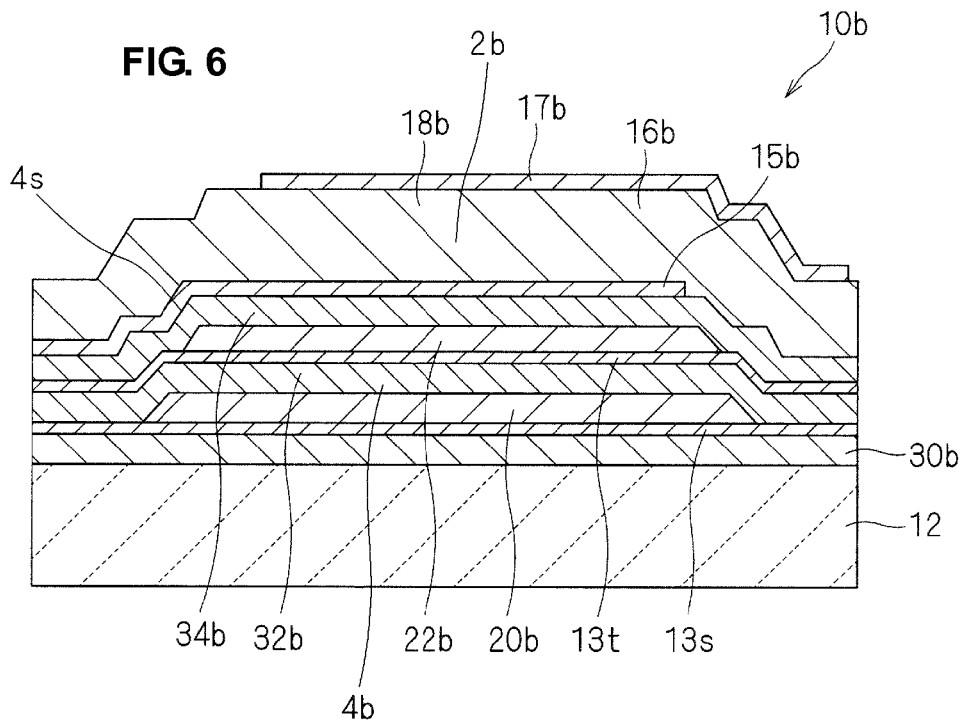
FIG. 6 is a sectional view of a piezoelectric resonator according to a preferred embodiment of the present invention.

As indicated by a sectional view shown in FIG. 6, the piezoelectric resonator 10b of Example 3 preferably has substantially the same configuration as that of the piezoelectric resonator 10 of Example 1 shown in FIG. 1, and the same effects as those in Example 1 are obtained.

As shown in FIG. 6, the piezoelectric resonator 10b of Example 3 is different from Example 1, and the width of the high acoustic impedance layer 20b on the substrate 12 side is larger than the width of the high acoustic impedance layer 22b on the vibration portion 2b side. Such high acoustic impedance layers 20b and 22b having different dimensions can be formed by using photomasks having different dimensions for individual high acoustic impedance layers 20b and 22b.

Consequently, the number of height differences formed on the uppermost surface 4s of the acoustic reflector portion 4b extending around the vibration portion 2b (that is, a surface, which is in contact with the lower electrode 15b or the piezoelectric thin film 16b, of the low acoustic impedance layer 34b farthest from the substrate 12) increases from one to two. As a result, the height per height difference becomes small, and occurrences of a break and thickness reduction of the lower electrode 15b become more difficult as compared with that in the case where the number of height difference is one. Therefore, the quality of the piezoelectric resonator 10b becomes more stable.

EXAMPLE 4

A piezoelectric resonator 10c of Example 4 will be described with reference to FIG. 7.

Figure 7:
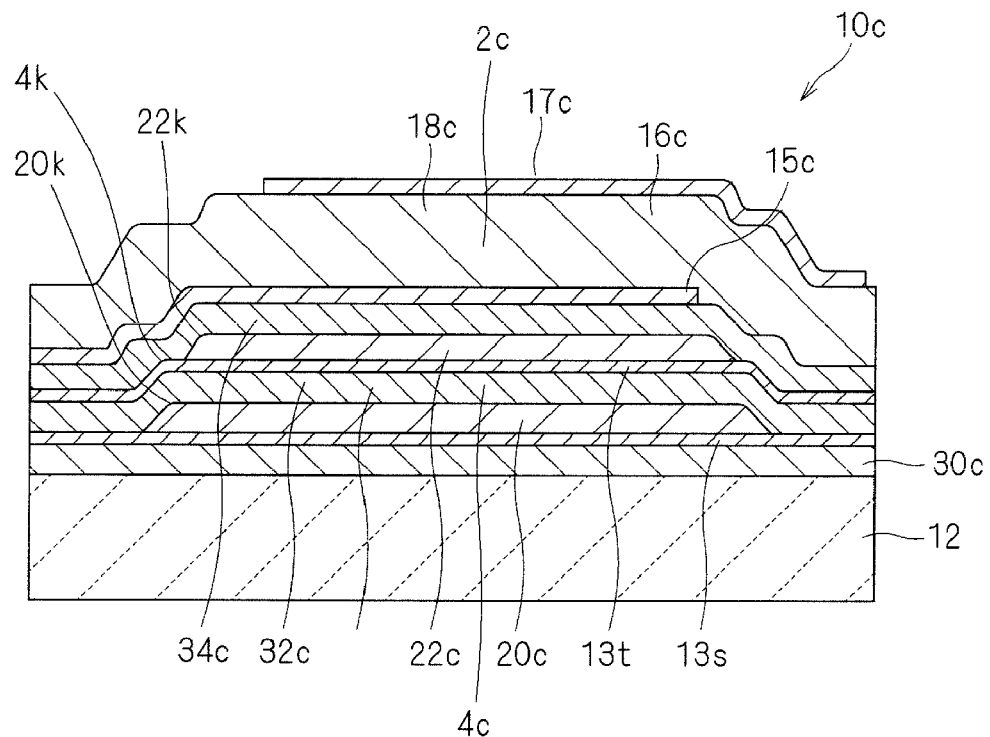
FIG. 7 is a sectional view of a piezoelectric resonator according to a preferred embodiment of the present invention.
Figure 8:
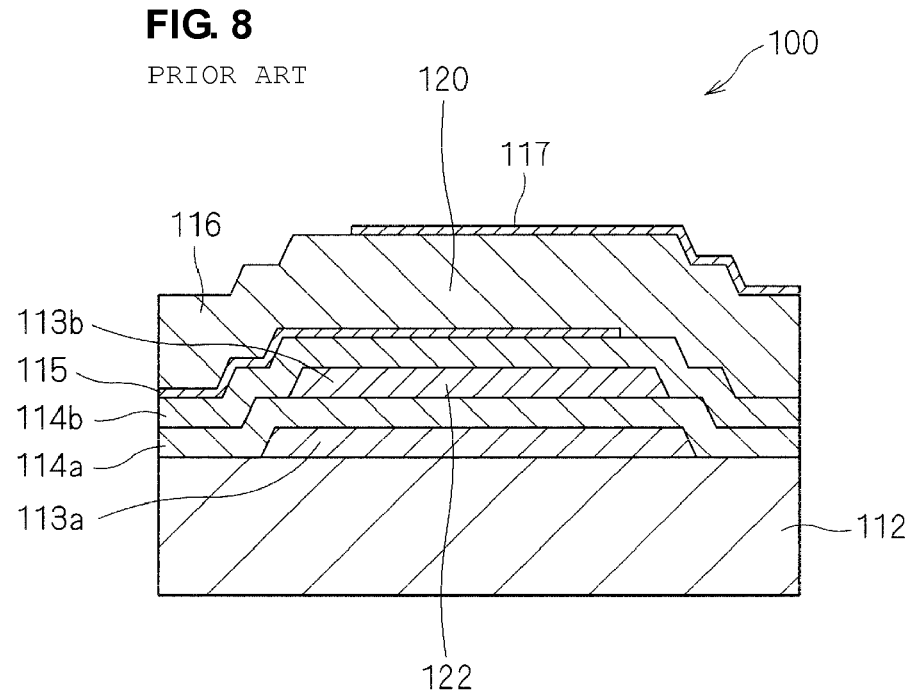
FIG. 8 is a sectional view of a conventional piezoelectric resonator.
Figure 9:
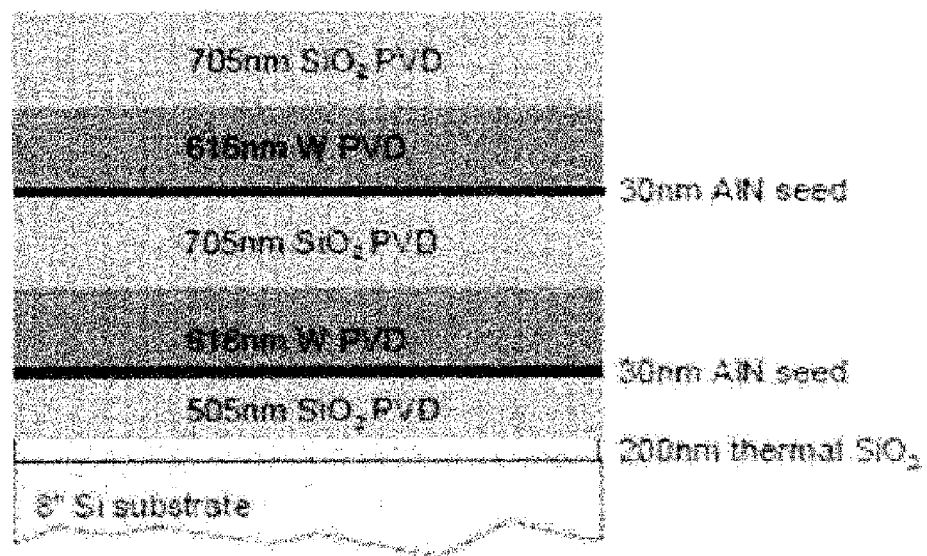
FIG. 9 is a sectional view of a conventional piezoelectric resonator.

As indicated by a sectional view shown in FIG. 7, the piezoelectric resonator 10c of Example 4 has substantially the same configuration as that of the piezoelectric resonator 10b of Example 3 shown in FIG. 6, and the same effects as those in Example 3 are obtained.

The point different from Example 3 is that etching end surfaces 20k and 22k of the high acoustic impedance layers 20c and 22c are worked into the shape of a curved surface.

For example, before etching of the high acoustic impedance layers 20c and 22c is conducted, a mask pattern of photoresist is formed in the following procedure.

(1) Application of photoresist
(2) Baking (heating)
(3) Exposure
(4) Development
(5) Secondary baking (heating)

A normal taper is formed on the end surfaces of the photoresist by conducting the secondary baking. The etching end surfaces 20k and 22k of the high acoustic impedance layers 20c and 22c can be worked into the shape of a curved surface by conducting etching through the use of the resulting photoresist.

Regarding the acoustic reflector portion 4c, the corner 4k of the height difference formed around the vibration portion 2 is worked into the shape of a curved surface. Consequently, a sharp change in angle is eliminated and occurrences of a break and thickness reduction of the lower electrode 15b formed thereon become more difficult.

Therefore, the quality of the piezoelectric resonator 10c becomes more stable.

As described above, the acoustic reflector portion preferably includes the high acoustic impedance layer and the low acoustic impedance layer having the compressive stresses and the adjustment layer having the tensile stress. As a result, the total stress of the acoustic reflector portion can be relaxed and minimized, so that an occurrence of interlayer film peeling can be prevented.

Since the total stress of the acoustic reflector portion can be relaxed and minimized, warping of a wafer can be reduced. Consequently, in the step of forming a resonator portion, for example, in an exposure apparatus used in a photolithography step, a wafer can be fixed with a vacuum chuck, so that patterning position accuracy is improved.

Furthermore, since the total stress of the acoustic reflector portion can be relaxed and minimized, substrate cracking can be prevented and the yield of product can be improved.

In the case where tungsten (W) or molybdenum (Mo) is preferably used for the high acoustic impedance layer, silicon oxide ($SiO_2$) or carbon-containing silicon oxide (SiOC) is preferably used for the low acoustic impedance layer, for example, and Ti is preferably used for the adhesive layer, every layer can be etched easily with a fluorine based gas, e.g., $CF_4$. Consequently, for example, in the case where a laminated structure of $W/SiO_2$ or a laminated structure of $W/Ti/SiO_2$ is used for the high acoustic impedance layers and the low acoustic impedance layers disposed alternately in the acoustic reflector portion, when the W layer or the W/Ti layer is etched, the $SiO_2$ layer serving as a substrate is etched through over etching. In such a case, proceeding of etching into the substrate can be prevented by using a material (for example, AlN) that is not etched easily with the fluorine based gas, as the adjustment layer, between the W film or the W/Ti film and the $SiO_2$ layer.

Since over etching can be prevented by using a material (for example, AlN) not etched easily with the fluorine based gas, as the adjustment layer, the height difference of the acoustic reflector portion does not increase and, thereby, an occurrence of a break of the lower electrode can be prevented.

In the case where the crystallinity of the W film is improved, the compressive stress is enhanced. If the compressive stress is large, film peeling occurs easily. However, in preferred embodiments of the present invention, the total stress can be adjusted by the adjustment layer, so that film peeling does not occur and the W film exhibiting a small elastic wave loss can be used. Consequently, the resonance characteristics are improved.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric resonator comprising:
   a substrate;
   a vibration portion including a piezoelectric thin film sandwiched between a pair of electrodes; and
   an acoustic reflector portion disposed between the substrate and the vibration portion, the acoustic reflector portion including:
      a plurality of low acoustic impedance layers made of a material having relatively low acoustic impedance and a plurality of high acoustic impedance layers made of a material having relatively high acoustic impedance, the low and high acoustic impedance layers being disposed alternately between the substrate and the vibration portion; and
   at least one adjustment layer disposed between one of the high acoustic impedance layers and one of the low acoustic impedance layers, the at least one adjustment layer having an acoustic impedance value between the acoustic impedance of the high acoustic impedance layers and the acoustic impedance of the low acoustic impedance layers; wherein
   the low acoustic impedance layers and the high acoustic impedance layers have compressive stresses, and the at least one adjustment layer has a tensile stress.

2. The piezoelectric resonator according to claim 1, wherein the at least one adjustment layer is made of a material that is resistant to being etched with a fluorine based gas.

3. The piezoelectric resonator according to claim 1, wherein the low acoustic impedance layer includes silicon oxide, the high acoustic impedance layer includes tungsten, and the at least one adjustment layer includes aluminum nitride.

4. The piezoelectric resonator according to claim 1, wherein the acoustic reflector portion between the substrate and the vibration portion includes at least one adhesive layer disposed between the high acoustic impedance layers and the adjustment layers.

5. The piezoelectric resonator according to claim 4, wherein the adhesive layer includes titanium.

* * * * *